(12) United States Patent
Wengreen

(10) Patent No.: US 10,194,544 B2
(45) Date of Patent: Jan. 29, 2019

(54) MOUNTING SYSTEMS FOR MEDIA PLAYERS

(71) Applicant: Innovelis, Inc., Sammamish, WA (US)

(72) Inventor: Eric John Wengreen, Sammamish, WA (US)

(73) Assignee: Innovelis, Inc., Sammamish, WA (US)

( * ) Notice: Subject to any disclaimer, the term of this patent is extended or adjusted under 35 U.S.C. 154(b) by 0 days.

(21) Appl. No.: 15/424,837

(22) Filed: Feb. 4, 2017

(65) Prior Publication Data

US 2017/0150620 A1 May 25, 2017

(51) Int. Cl.
*H05K 5/02* (2006.01)
*F16M 13/02* (2006.01)
*A47B 97/00* (2006.01)

(52) U.S. Cl.
CPC .......... *H05K 5/0204* (2013.01); *F16M 13/02* (2013.01); *A47B 97/001* (2013.01)

(58) Field of Classification Search
CPC ......... H05K 5/0204; H05K 7/14; H04M 1/04; F16M 13/02; F16M 13/00; F16M 13/022; F16M 11/041; G06F 1/1632; G06F 1/1626; A47B 97/001
See application file for complete search history.

(56) References Cited

U.S. PATENT DOCUMENTS

| | | |
|---|---|---|
| 1,618,573 A | 2/1927 | Cole |
| 2,584,646 A | 2/1952 | Wagstaff |
| 3,091,378 A | 5/1963 | O'Dwyer |
| D196,542 S | 10/1963 | Zelnick |
| 3,176,950 A | 4/1965 | Hittesdorf |
| 3,279,009 A | 10/1966 | Teasdale |
| 3,294,298 A | 12/1966 | Danielson |
| 3,477,679 A | 11/1969 | Lovitz |
| 3,990,617 A | 11/1976 | Carter |
| D242,766 S | 12/1976 | Neece |
| 4,067,532 A | 1/1978 | Viteretto |
| 4,158,450 A | 6/1979 | Suzuki |
| 4,467,244 A | 8/1984 | Dickie |
| 4,519,656 A | 5/1985 | Raz |
| D280,466 S | 9/1985 | Seltzer |
| D282,034 S | 1/1986 | Janke |
| 4,602,761 A | 7/1986 | Carter |
| 4,697,780 A | 10/1987 | Wenkman |
| 4,746,042 A | 5/1988 | King |
| 4,771,927 A | 9/1988 | Ventura |
| 4,815,683 A | 3/1989 | Ferrante |
| 4,825,590 A | 5/1989 | Cullinane |

(Continued)

OTHER PUBLICATIONS

Level Mount Installation Manual—Copyright 2012—Downloaded on Oct. 10, 2017 from https://levelmount.com/Pdf/Instructions/Large-Extra%20Large%20Fixed-Tilt%20Mounts.pdf.

*Primary Examiner* — Patrick D Hawn

(57) ABSTRACT

Mounting systems can be configured to couple an electronic device to a wall. In some embodiments, mounting systems include a base having a backside configured to face inward towards the wall and a frontside configured to face outward away from the wall. Mounting systems can also include a first sidewall and a second sidewall that are coupled to the base, protrude away from the wall, and help secure the electronic device to the base. In several embodiments, protrusions help secure the electronic device to the mounting system.

16 Claims, 12 Drawing Sheets

(56) References Cited

U.S. PATENT DOCUMENTS

| | | |
|---|---|---|
| 4,826,115 A | 5/1989 | Novitski |
| 4,840,773 A | 6/1989 | Wade |
| 4,852,843 A | 8/1989 | Chandler |
| 4,974,764 A | 12/1990 | Cantwell |
| D317,157 S | 5/1991 | Jondelius |
| 5,038,985 A | 8/1991 | Chapin |
| 5,092,395 A | 3/1992 | Amidzich |
| 5,227,582 A | 7/1993 | Velasco |
| 5,273,690 A | 12/1993 | McDowell |
| 5,297,318 A | 3/1994 | Adolphson |
| D351,341 S | 10/1994 | Hung |
| 5,385,282 A | 1/1995 | Chen |
| 5,400,990 A | 3/1995 | Frankel |
| D359,616 S | 6/1995 | Ishibashi |
| D361,335 S | 8/1995 | Rudkiewicz |
| D361,462 S | 8/1995 | Newham |
| D369,465 S | 5/1996 | Scheid |
| 5,535,093 A | 7/1996 | Noguchi |
| D376,787 S | 12/1996 | Calfee |
| 5,593,124 A | 1/1997 | Wang |
| 5,619,395 A | 4/1997 | McBride |
| 5,619,774 A | 4/1997 | Perry |
| D388,107 S | 12/1997 | Huckins |
| D390,849 S | 2/1998 | Richter |
| 5,850,998 A | 12/1998 | Parsey |
| D407,408 S | 3/1999 | Hoff |
| D409,079 S | 5/1999 | Sobczynski |
| 5,899,371 A | 5/1999 | Weliver |
| D411,542 S | 6/1999 | Richter |
| 5,914,707 A | 6/1999 | Kono |
| 5,961,083 A | 10/1999 | Hartman |
| 5,979,724 A | 11/1999 | Loewenthal |
| D420,149 S | 2/2000 | Hersh |
| 6,039,173 A | 3/2000 | Crow |
| D425,353 S | 5/2000 | Foy |
| 6,073,901 A | 6/2000 | Richter |
| 6,102,660 A | 8/2000 | Lee |
| 6,105,923 A | 8/2000 | Robertson |
| D431,250 S | 9/2000 | Richter |
| 6,163,997 A | 12/2000 | Deralas |
| 6,193,546 B1 | 2/2001 | Sadler |
| D443,493 S | 6/2001 | Skeem |
| 6,275,885 B1 | 8/2001 | Chin |
| 6,336,615 B1 | 1/2002 | Jeon |
| D456,024 S | 4/2002 | Richter |
| D456,413 S | 4/2002 | Malson |
| 6,445,290 B1 | 9/2002 | Fingal |
| 6,485,144 B1 | 11/2002 | Liao |
| D471,547 S | 3/2003 | Ruohonen |
| 6,554,527 B1 | 4/2003 | O'Donnell |
| 6,560,983 B1 | 5/2003 | Schimmeyer |
| 6,691,374 B2 | 2/2004 | Coyne |
| 6,888,940 B1 | 5/2005 | Deppen |
| D508,605 S | 8/2005 | Shih-Ming |
| 6,939,641 B2 | 9/2005 | Kincaid |
| 6,983,126 B1 | 1/2006 | Saalman |
| D518,704 S | 4/2006 | Miao |
| 7,047,601 B1 | 5/2006 | Vernon-Woods |
| 7,067,737 B2 | 6/2006 | Mallen |
| 7,079,384 B2 | 7/2006 | Wang |
| 7,080,764 B2 | 7/2006 | McNicholas |
| 7,113,218 B2 | 9/2006 | Battles |
| D529,713 S | 10/2006 | Guyot |
| D529,905 S | 10/2006 | Richter |
| D530,713 S | 10/2006 | Richter |
| D533,175 S | 12/2006 | Richter |
| 7,145,603 B2 | 12/2006 | Whitby |
| D535,826 S | 1/2007 | Toghanian |
| D536,239 S | 2/2007 | Tallman |
| 7,222,762 B2 | 5/2007 | Rees |
| D545,343 S | 6/2007 | Braun |
| D547,863 S | 7/2007 | Heinsch |
| D551,008 S | 9/2007 | Hidalgo |
| D553,352 S | 10/2007 | Allen |
| D557,266 S | 12/2007 | Hughes |
| D560,411 S | 1/2008 | Chung |
| D564,529 S | 3/2008 | Hughes |
| D565,399 S | 4/2008 | Grey |
| D568,889 S | 5/2008 | Hughes |
| 7,367,089 B2 | 5/2008 | Cooke |
| D570,801 S | 6/2008 | Allen |
| D586,795 S | 2/2009 | Richter |
| D596,172 S | 7/2009 | Ahlqvist |
| D598,945 S | 8/2009 | Gillespie |
| 7,580,255 B2 | 8/2009 | Crooijmans |
| D601,000 S | 9/2009 | Cole |
| D609,030 S | 2/2010 | Barabas |
| D610,579 S | 2/2010 | Behar |
| D624,949 S | 10/2010 | Nakayama |
| D625,729 S | 10/2010 | McNames |
| D628,611 S | 12/2010 | Lewis |
| 7,854,420 B2 | 12/2010 | Depay |
| D633,503 S | 3/2011 | Bo |
| 7,959,121 B1 | 6/2011 | Barnes |
| 7,980,435 B2 | 7/2011 | Tages |
| 8,020,821 B2 * | 9/2011 | Chen ..................... F16M 13/02 248/220.22 |
| D648,727 S | 11/2011 | Van Den Nieuwenhuizen |
| 8,074,951 B2 * | 12/2011 | Carnevali ............... B60R 11/02 108/143 |
| D657,362 S | 4/2012 | Lister |
| D662,491 S | 6/2012 | Andre |
| D667,411 S | 9/2012 | Kim |
| D669,890 S | 10/2012 | Hopkins |
| 8,282,058 B2 * | 10/2012 | Lundrigan ........... F16M 11/046 248/220.22 |
| 8,297,440 B2 * | 10/2012 | Schmidt ................ F16M 11/10 206/320 |
| D672,308 S | 12/2012 | Cobbett |
| 8,322,584 B2 | 12/2012 | Dethmers |
| D686,629 S | 7/2013 | Trinh |
| D690,707 S | 10/2013 | Minn |
| 8,544,805 B2 | 10/2013 | Virgin |
| D695,748 S | 12/2013 | Morris |
| D700,832 S | 3/2014 | Ng |
| D705,229 S | 5/2014 | Wengreen |
| D710,340 S | 8/2014 | Wengreen |
| D710,363 S | 8/2014 | Wengreen |
| D710,836 S | 8/2014 | Wengreen |
| D712,906 S | 9/2014 | Wengreen |
| D713,395 S | 9/2014 | Godycki |
| D713,399 S | 9/2014 | Green |
| 8,847,549 B2 | 9/2014 | Graham |
| 8,848,113 B2 | 9/2014 | Wengreen |
| D714,793 S | 10/2014 | Kim |
| D716,580 S | 11/2014 | Wengreen |
| D717,307 S | 11/2014 | Chun |
| D717,804 S | 11/2014 | Budge |
| 8,896,768 B2 | 11/2014 | Wengreen |
| 8,934,060 B1 | 1/2015 | Wengreen |
| 8,934,061 B1 | 1/2015 | Wengreen |
| 8,939,417 B1 | 1/2015 | Wengreen |
| D723,042 S | 2/2015 | Lee |
| 8,988,616 B2 | 3/2015 | Wengreen |
| D729,544 S | 5/2015 | Wengreen |
| D732,939 S | 6/2015 | Cannaverde |
| D733,105 S | 6/2015 | Wengreen |
| D733,542 S | 7/2015 | Cannaverde |
| D733,691 S | 7/2015 | Wengreen |
| D734,305 S | 7/2015 | Wengreen |
| D735,174 S | 7/2015 | Wengreen |
| D739,410 S | 9/2015 | Chun |
| 9,131,195 B2 | 9/2015 | Wengreen |
| 9,163,779 B2 * | 10/2015 | Funk ..................... F16M 13/02 |
| D742,387 S | 11/2015 | Xiang |
| 9,185,953 B2 | 11/2015 | Whitten |
| D746,599 S | 1/2016 | Olson |
| D749,549 S | 2/2016 | Wengreen |
| D749,597 S | 2/2016 | Wengreen |
| D750,633 S | 3/2016 | Minn |
| D751,563 S | 3/2016 | Wengreen |
| D752,415 S | 3/2016 | Lu |
| 9,339,112 B2 | 5/2016 | Wengreen |
| D759,005 S | 6/2016 | Murakami |

(56) References Cited

U.S. PATENT DOCUMENTS

| | | |
|---|---|---|
| D761,236 S | 7/2016 | Wengreen |
| D763,666 S | 8/2016 | Wengreen |
| D763,835 S | 8/2016 | Wengreen |
| D765,063 S | 8/2016 | Wengreen |
| D765,064 S | 8/2016 | Wengreen |
| 9,404,615 B1* | 8/2016 | Gonzalez ............... F16M 11/04 |
| D765,646 S | 9/2016 | Deng |
| D765,651 S | 9/2016 | Liu |
| D767,377 S | 9/2016 | Sekula |
| D770,171 S | 11/2016 | Lai |
| D772,217 S | 11/2016 | Alesi |
| D777,167 S | 1/2017 | Wengreen |
| 9,543,082 B1 | 1/2017 | Wengreen |
| D779,466 S | 2/2017 | Wengreen |
| 9,578,960 B1 | 2/2017 | Wu |
| D795,820 S | 8/2017 | Wengreen |
| D798,305 S * | 9/2017 | Wengreen ..................... D14/447 |
| 2002/0079864 A1* | 6/2002 | Soumi .................. H02J 7/0044 320/115 |
| 2005/0023419 A1 | 2/2005 | Frankel |
| 2005/0211861 A1 | 9/2005 | Lee |
| 2005/0236541 A1 | 10/2005 | Chang |
| 2006/0186290 A1* | 8/2006 | Carnevali ............. E05B 65/006 248/221.11 |
| 2006/0224575 A1 | 10/2006 | Ostojic |
| 2006/0274495 A1* | 12/2006 | Nakamura ............. G06F 1/162 361/679.01 |
| 2007/0097617 A1 | 5/2007 | Searby |
| 2007/0235609 A1 | 10/2007 | Chun |
| 2007/0264169 A1 | 11/2007 | Chen |
| 2008/0078793 A1 | 4/2008 | Brown |
| 2009/0218454 A1 | 9/2009 | Stanley |
| 2009/0270727 A1* | 10/2009 | Zhao ....................... A61B 8/00 600/437 |
| 2009/0296997 A1 | 12/2009 | Rocheford |
| 2010/0270190 A1 | 10/2010 | Howard |
| 2010/0281671 A1 | 11/2010 | De Vaan |
| 2010/0288895 A1 | 11/2010 | Shamie |
| 2010/0314277 A1 | 12/2010 | Murray |
| 2011/0242439 A1 | 10/2011 | Calderon |
| 2012/0025035 A1* | 2/2012 | Huang ................. F16M 11/041 248/122.1 |
| 2012/0126081 A1 | 5/2012 | Wengreen |
| 2012/0127379 A1 | 5/2012 | Wengreen |
| 2012/0168516 A1 | 7/2012 | Bolger |
| 2012/0280014 A1 | 11/2012 | Lopez-Apodaca |
| 2012/0312950 A1 | 12/2012 | Sears |
| 2013/0032617 A1* | 2/2013 | Adelman .................. A45F 5/00 224/191 |
| 2013/0050932 A1* | 2/2013 | Williams .............. G06F 1/1632 361/679.41 |
| 2013/0092811 A1* | 4/2013 | Funk ..................... F16M 13/02 248/371 |
| 2014/0061406 A1 | 3/2014 | Chevalier |
| 2014/0103179 A1 | 4/2014 | Lipke |
| 2014/0241705 A1 | 8/2014 | Wengreen |
| 2015/0070835 A1 | 3/2015 | McLean |
| 2015/0212544 A1 | 7/2015 | Chen |
| 2015/0305502 A1 | 10/2015 | Wengreen |
| 2016/0007735 A1 | 1/2016 | Gallup |
| 2016/0119458 A1 | 4/2016 | Gunther |
| 2016/0120295 A1 | 5/2016 | Rowley |
| 2016/0218535 A1 | 7/2016 | Prete |
| 2016/0234955 A1 | 8/2016 | Wengreen |
| 2016/0241289 A1 | 8/2016 | Wieth |
| 2017/0150620 A1 | 5/2017 | Wengreen |
| 2017/0208945 A1 | 7/2017 | Wengreen |

* cited by examiner

MOUNTING SYSTEMS FOR MEDIA PLAYERS

BACKGROUND

Field

Various embodiments disclosed herein relate to mounting systems and mounting methods. Certain embodiments relate to mounting systems configured to couple electronic devices to a wall.

Description of Related Art

Electronic devices can be electronically and even physically coupled to other electronic devices. For example, a digital media player can be coupled to a television by a High-Definition Multimedia Interface (HDMI) cable to enable the television to display media, such as movies or games, from the digital media player. The digital media player can receive media from data storage devices (such as discs or internal hard drives) or from the Internet through many different content providers such as Netflix Inc., Microsoft Corporation, and Sony Corporation.

Mounting systems can be used to couple electronic devices to a wall. Mounting systems can hold electronic devices while the electronic devices provide media from the Internet and/or from data storage devices to televisions. Electronic devices can be damaged if they fall out of mounting systems. Thus, there is a need for systems and methods to securely mount electronic devices to diverse types of walls and surfaces.

SUMMARY

Mounting systems can be used to couple electronic devices to a wall, such as a wall of a building or a wall of a television.

In some embodiments, a mounting system is configured to couple an electronic device to a wall. The mounting system can comprise a base having a backside configured to face inward towards the wall and a frontside configured to face outward away from the wall. The mounting system can comprise a first sidewall and a second sidewall that are coupled to the base, are configured to protrude away from the wall, and are configured to secure the electronic device to the base. The mounting system can comprise a first protrusion, a second protrusion, a third protrusion, and a fourth protrusion coupled to the base and configured to push the electronic device outward away from the wall. As used herein, "push" does not necessarily mean move but means to press against with force.

In several embodiments, the base comprises a hole. The first protrusion can be spring-loaded outward from the hole. The first protrusion can be configured such that pressing the first protrusion inward moves at least a second portion of the first protrusion inward through the hole of the base. Moving at least a second portion of the first protrusion inward through the hole can be accomplished by moving the first protrusion part way through the hole and does not necessarily mean moving an object all the way through the hole. The hole can be a "through hole" or can be a hole with a closed bottom (such as a valley). In some embodiments, the hole is much wider than it is deep. Thus, holes can be very shallow.

Embodiments can use any type of spring. For example, embodiments can use cantilever springs, coil springs, tension springs, extension springs, torsion springs, constant springs, variable springs, flat springs, machined springs, serpentine springs, helical springs, volute springs, hairsprings, balance springs, leaf springs, V-springs, Belleville springs, gas springs, mainsprings, negator springs, progressive rate coil springs, rubber bands, spring washers, torsion springs, and/or wave springs. Springs can be made from any suitable material including molded plastic, elastic materials, and/or spring steel.

In several embodiments, the base comprises a hole configured to enable the first protrusion to move inward through the hole (e.g., as the first protrusion is pressed inward in response to inserting the electronic device into the mount). At least a first portion of the first protrusion can be anchored to a side of the hole. As used herein, anchor means to hold in place. An anchor can be a rigid connection. In some embodiments, anchors are not rigid connections but instead are features that block unwanted movement. For example, an anchor can be an outer wall that prevents the first protrusion from moving too far outward while still permitting the first protrusion to move inward in response to inserting the electronic device.

In some embodiments, at least a portion of the first protrusion is located between the first and second sidewalls. A spring can couple the protrusion to the base such that coupling the electronic device to the base by placing the electronic device at least partially between the first and second sidewalls presses the protrusion inward by overcoming a resistance force of the spring. The spring can be any type of spring including a cantilever spring and a coil spring.

In several embodiments, the first protrusion comprises a cantilever beam having a first portion anchored to the base and a second portion configured to bend inward in response to coupling the electronic device to the base by placing the electronic device at least partially between the first and second sidewalls.

In some embodiments, the first portion is located farther inward than the second portion such that (A) the first portion is not configured to collide with the electronic device as the electronic device is coupled to the mounting system and (B) the second portion is configured to collide with the electronic device as the electronic device is coupled to the mounting system.

In some embodiments, the cantilever beam is curved such that the first portion is located further inward than the second portion. The cantilever beam can comprise a first section and a second section. The first section can be oriented at a greater angle relative to the base than the second section is oriented relative to the base. (The outer-facing wall of the base can define the orientation of the base.) The angle of the first section can facilitate a gradual transition as the electronic device is inserted into the mount such that pressing the cantilever beam inward does not require a large electronic device insertion force.

In several embodiments, the base comprises a hole. The cantilever beam can be located at least partially inside the hole such that the second portion of the cantilever beam is configured to bend inward at least partially through the hole in response to coupling the electronic device to the base.

In some embodiments, the first portion is anchored to the base inside the hole of the base. The second portion can be located outward relative to the hole such that the second portion is configured to collide with the electronic device as the electronic device is coupled to the mounting system.

In several embodiments, a rubber layer is coupled to an outward facing surface of the cantilever beam. The system can comprise the electronic device coupled at least partially between the first and second sidewalls such that at least a portion of the rubber layer is compressed between the electronic device and the cantilever beam. The base and sidewalls (and other parts of the mount) can be made from a first material. The first material can be molded plastic. The rubber layer can be made from a second material that is softer than the first material.

In some embodiments, the system is configured to enable inserting the electronic device into the system in a first direction. The first protrusion can comprise a cantilever beam having an anchored end and a distal end configured to move relative to the anchored end. The cantilever beam comprises an orientation defined from the anchored end to the distal end. The orientation can be within plus or minus 30 degrees of parallel to or perpendicular to the first direction.

In several embodiments, the base can comprise a hole. The cantilever beam can be located at least partially in the hole. The cantilever beam can be curved outward. The cantilever beam can be configured to move at least partially inward through the hole in response to coupling the electronic device to the base.

In some embodiments, the base comprises a first side coupled to the first sidewall, a second side located opposite the first side and coupled to the second sidewall, a third side having a third sidewall oriented within plus or minus 20 degrees of perpendicular to the first and second sidewalls, and a fourth side located opposite the third side and configured to enable inserting the electronic device at least partially into the mounting system between the first and second sidewalls. The first protrusion can have an outermost portion located between the first and second sidewalls. The outermost portion can be coupled to the base by a spring such that a neutral position of the outermost portion is located in an insertion path of the electronic device such that inserting the electronic device pushes the outermost portion inward while the outermost portion applies an outward force on the electronic device. The first sidewall and the second sidewall can be configured to resist the outward force of the first protrusion.

In several embodiments, the first protrusion protrudes towards the fourth side. In some embodiments, the first protrusion protrudes away from the fourth side. As used herein, the first protrusion can protrude toward the fourth side without protruding directly towards the fourth side. As used herein, the first protrusion can protrude away from the fourth side without protruding directly away from the fourth side. "Toward" is used broadly to mean in the direction of an object and does not require pointing exactly at an object. For example, protruding towards a side can be accomplished by protruding in a direction that makes the distal end of the protrusion closer to the side.

In some embodiments, the mounting system comprises a fourth sidewall located opposite the third sidewall and coupled to the base by a flex arm configured to bend to enable the fourth sidewall to move inward out of the insertion path of the electronic device. This fourth sidewall can be much smaller than other sidewalls.

In some embodiments, an electronic device is located at least partially between the first and second sidewalls. The first protrusion can be spring-loaded outward towards a first inward-facing wall of the electronic device such that the first inward-facing wall of the electronic device presses the first protrusion inward.

In several embodiments, the electronic device is located at least partially between an outward-facing wall of the base and a second inward facing wall coupled to the base by the first sidewall. The first protrusion can be coupled to the base by a second protrusion located farther inward than the outward-facing wall of the base. The first protrusion can be located farther outward than the outward-facing wall of the base.

Any of the systems described herein can be used with any of the methods described herein. Any of the methods described herein can be used with any of the systems described herein. Each of the system embodiments can be used as method embodiments.

In some embodiments, methods comprise coupling an electronic device to a wall (e.g., a wall of a building, a wall of a television). Embodiments can comprise obtaining a mounting system comprising a base having a backside facing inward towards the wall and a frontside facing outward away from the wall; a first sidewall and a second sidewall that are coupled to the base, protrude away from the wall, and secure the electronic device to the base; and a first protrusion coupled to the base and configured to push the electronic device outward away from the wall.

Methods can comprise coupling the mounting system to the wall. Methods can comprise overcoming a spring force of the first protrusion to move the first protrusion inward towards the wall by inserting at least a portion of the electronic device between the first and second sidewalls such that the first protrusion presses the electronic device outward while the first and second sidewalls block the electronic device from moving outward.

In several embodiments, the first protrusion comprises a cantilever beam having a first portion anchored to the base and a second portion coupled to the first portion. Embodiments can comprise bending the second portion inward in response to coupling the electronic device to the base.

In some embodiments, the first protrusion is spring-loaded outward from a hole. Embodiments can comprise pressing the first protrusion inward (such that the first protrusion moves at least a first portion of the first protrusion inward through the hole) by inserting the electronic device into the mount such that at least a portion of the electronic device is located between the first and second sidewalls. A spring can be located between the first protrusion and an inward side of the base such that the spring is configured to press the first protrusion outward into the insertion path of the electronic device.

BRIEF DESCRIPTION OF THE DRAWINGS

These and other features, aspects, and advantages are described below with reference to the drawings, which are intended to illustrate, but not to limit, the invention. In the drawings, like reference characters denote corresponding features consistently throughout similar embodiments.

DETAILED DESCRIPTION

Although certain embodiments and examples are disclosed below, inventive subject matter extends beyond the specifically disclosed embodiments to other alternative embodiments and/or uses, and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components.

For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Electronic devices include many types of devices. Electronic devices can include devices that send content (e.g., movies, TV shows, games) to televisions. Electronic devices can include Digital Video Disc (DVD) players, Blu-ray players, digital media extenders, and digital media players. Digital media players can include gaming consoles and devices such as Apple TV (made by Apple, Inc.), Roku players (made by Roku, Inc.), and Amazon Fire TV (made by Amazon.com, Inc.). Electronic devices can include gaming consoles such as Xbox devices (made by Microsoft Corporation), PlayStation devices (made by Sony Corporation), and Wii devices (sold by Nintendo of America Inc.).

Digital media players often transmit digital signals wirelessly or through a wire such as a High-Definition Multimedia Interface (HDMI) cable to a screen that displays an image based on the digital signal. Screens include computer monitors, televisions, and image-producing portions of movie projectors. Televisions include flat-panel displays, flat-screen televisions, and tube televisions.

Owners of digital media players may prefer to mount their digital media players near their screens. For example, a person who owns a flat screen television that is mounted on the wall might want to mount her Apple TV and her Xbox onto her flat screen television, onto the wall behind her flat screen television, or onto a wall near her television.

Mounting systems can be used to couple electronic devices to a wall, such as a wall of a building or a wall of a television.

Figure 1:
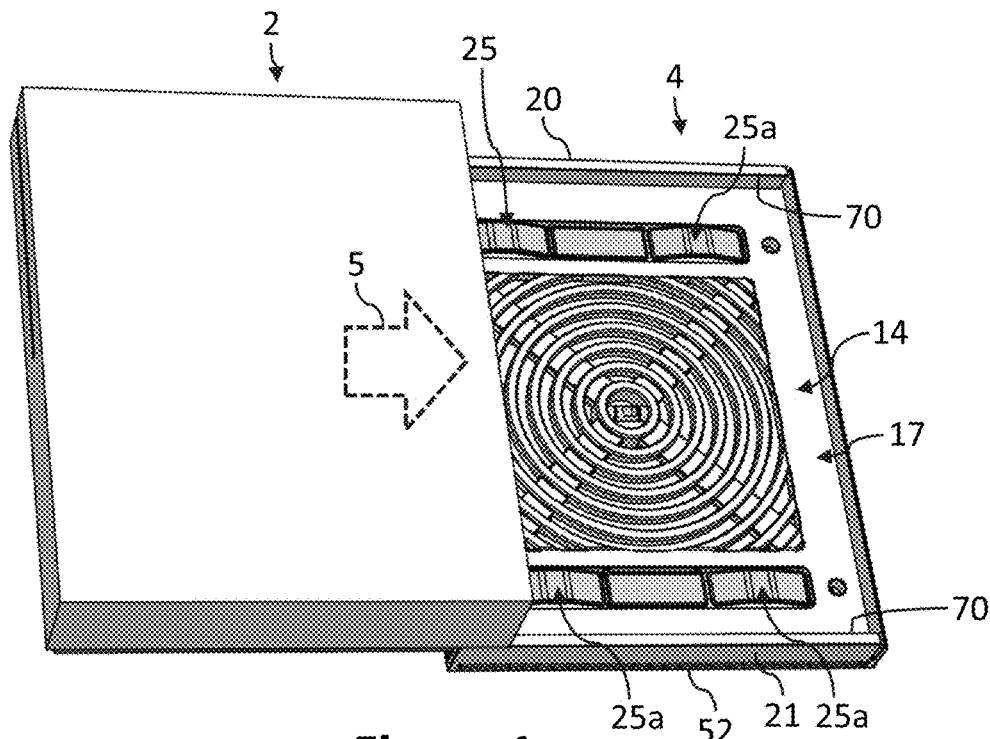
FIG. 1 illustrates a perspective view of an electronic device being inserted into a mounting system, according to some embodiments.
Figure 2:
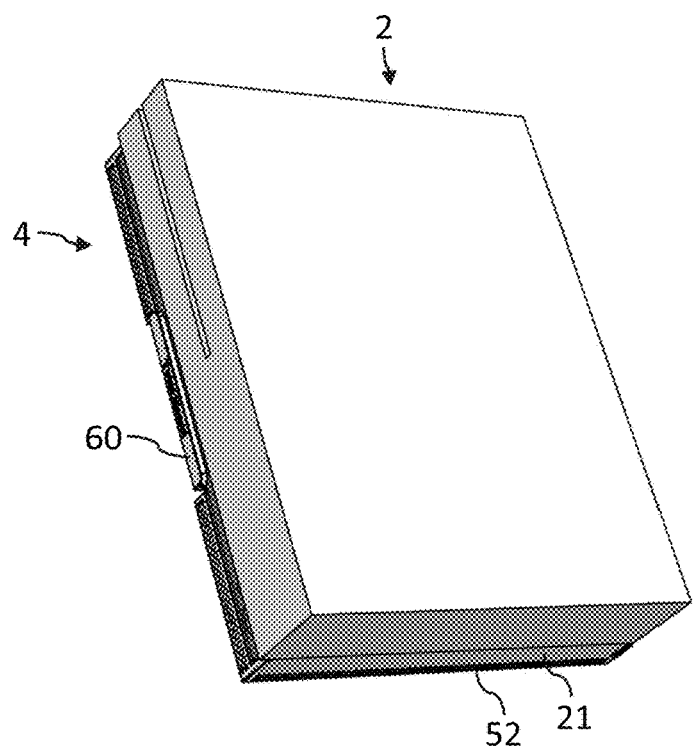
FIG. 2 illustrates a perspective view after the electronic device has been inserted into the mounting system, according to some embodiments.

FIG. 1 illustrates a perspective view of an electronic device 2 being inserted into a mounting system 4 (in the direction indicated by the arrow 5). FIG. 2 illustrates a perspective view after the electronic device 2 has been inserted into the mounting system 4.

The width of a particular style of electronic device (e.g., an Xbox One S) can vary slightly due to normal manufacturing tolerances. In addition, the width between the sidewalls 20, 21 of the mounting system 4 can also vary slightly due to normal manufacturing tolerances. This variability can be compensated for by making the nominal dimensions of the mount 4 deliberately larger than the corresponding dimensions of the electronic device 2. Although this approach ensures the electronic device 2 will fit inside the mounting system 4 even at extreme ends of the tolerance ranges, this approach also can result in a loose fit that can cause the electronic device 2 to "rattle" when coupled to a wall 6 by the mounting system 4.

Mounting systems 4 can eliminate this "rattle" by including protrusions 25, 25b, 25c configured to push the electronic device 2 away from the mounting system 4, base 14, and wall 6. Although pushing the electronic device 2 away from the wall 6 to which the electronic device 2 user wants to couple the electronic device 2 is highly counter-intuitive, the embodiments described herein are highly effective.

Figure 3:
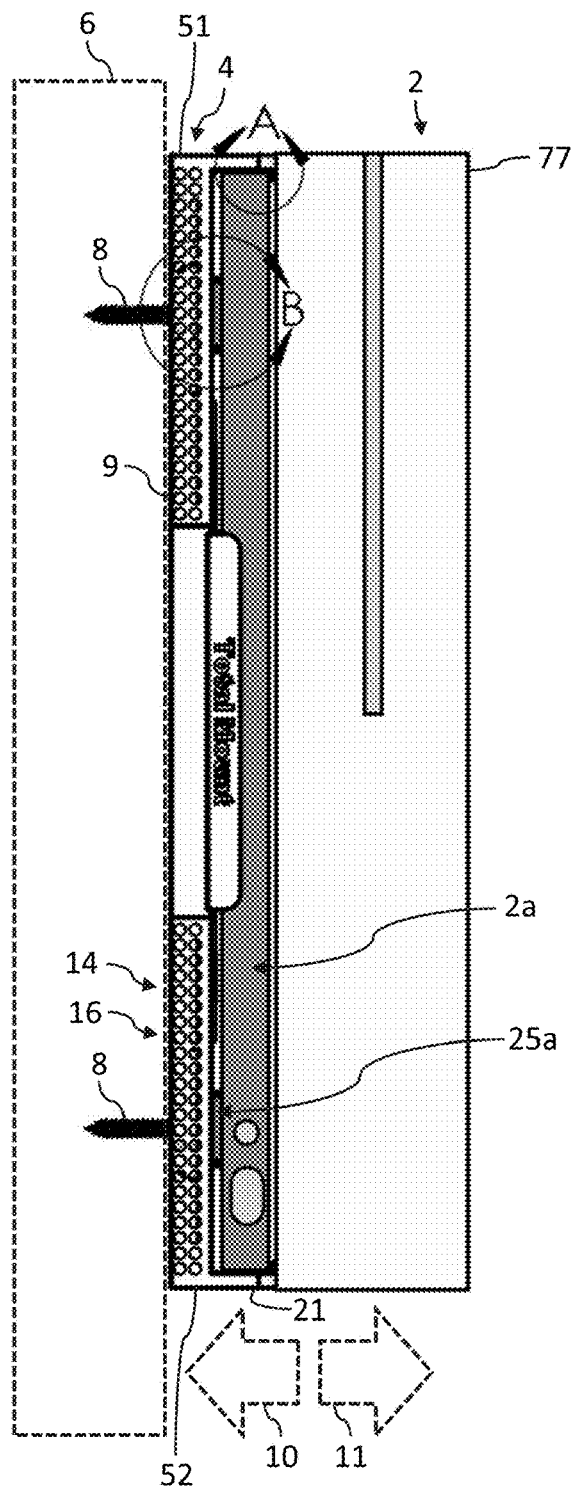
FIG. 3 illustrates a side view of an electronic device inserted into the mounting system such that the mounting system couples the electronic device to a wall, according to some embodiments.

FIG. 3 illustrates a side view of an electronic device 2 inserted into the mounting system 4 such that the mounting system 4 couples the electronic device to a wall 6. A cross-sectional view of the wall 6 is illustrated in FIG. 3. Screws 8, adhesive 9, and/or any other suitable means couple the mounting system 4 to the wall 6. Arrow 10 indicates an inward direction (i.e., a direction towards the wall 6). Arrow 11 indicates an outward direction (i.e., a direction away from the wall 6). In FIG. 3, the backside 16 of the base 14 faces inward towards the wall 6.

Referring now primarily to FIGS. 1-3, a mounting system 4 can be configured to couple an electronic device 2 to a wall 6. The mounting system 4 can comprise a base 14 having a backside 16 configured to face inward towards the wall 6 and a frontside 17 configured to face outward away from the wall 6; a first sidewall 20 and a second sidewall 21 that are coupled to the base 14, are configured to protrude away from the wall 6, and are configured to secure the electronic device 2 to the base 14; and a first protrusion 25 coupled to the base 14 and configured to push the electronic device 2 outward away from the wall 6. As used herein, "push" does not necessarily mean move but means to press against with force.

Figure 4:
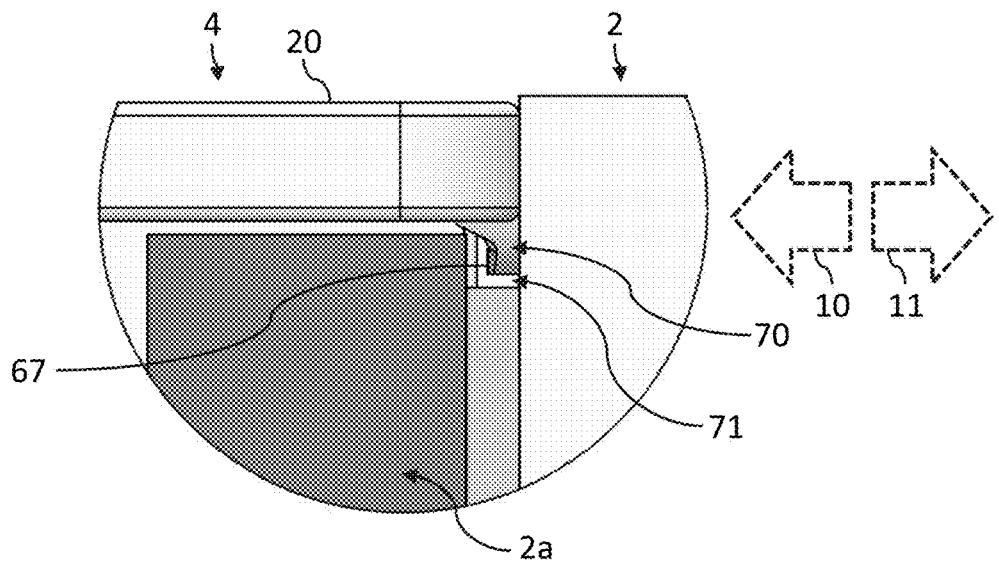
FIG. 4 illustrates a side, detailed view of the area indicated by Circle A in FIG. 3, according to some embodiments.
Figure 5:
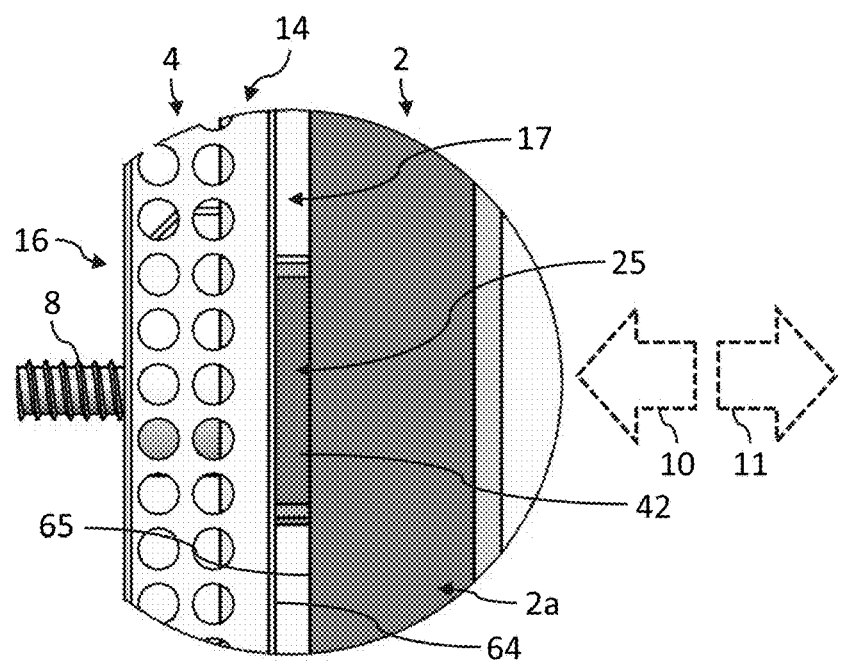
FIG. 5 illustrates a side, detailed view of the area indicated by Circle B in FIG. 3, according to some embodiments.

FIG. 4 illustrates a side, detailed view of the area indicated by Circle A in FIG. 3. FIG. 5 illustrates a side, detailed view of the area indicated by Circle B in FIG. 3.

Figure 6:
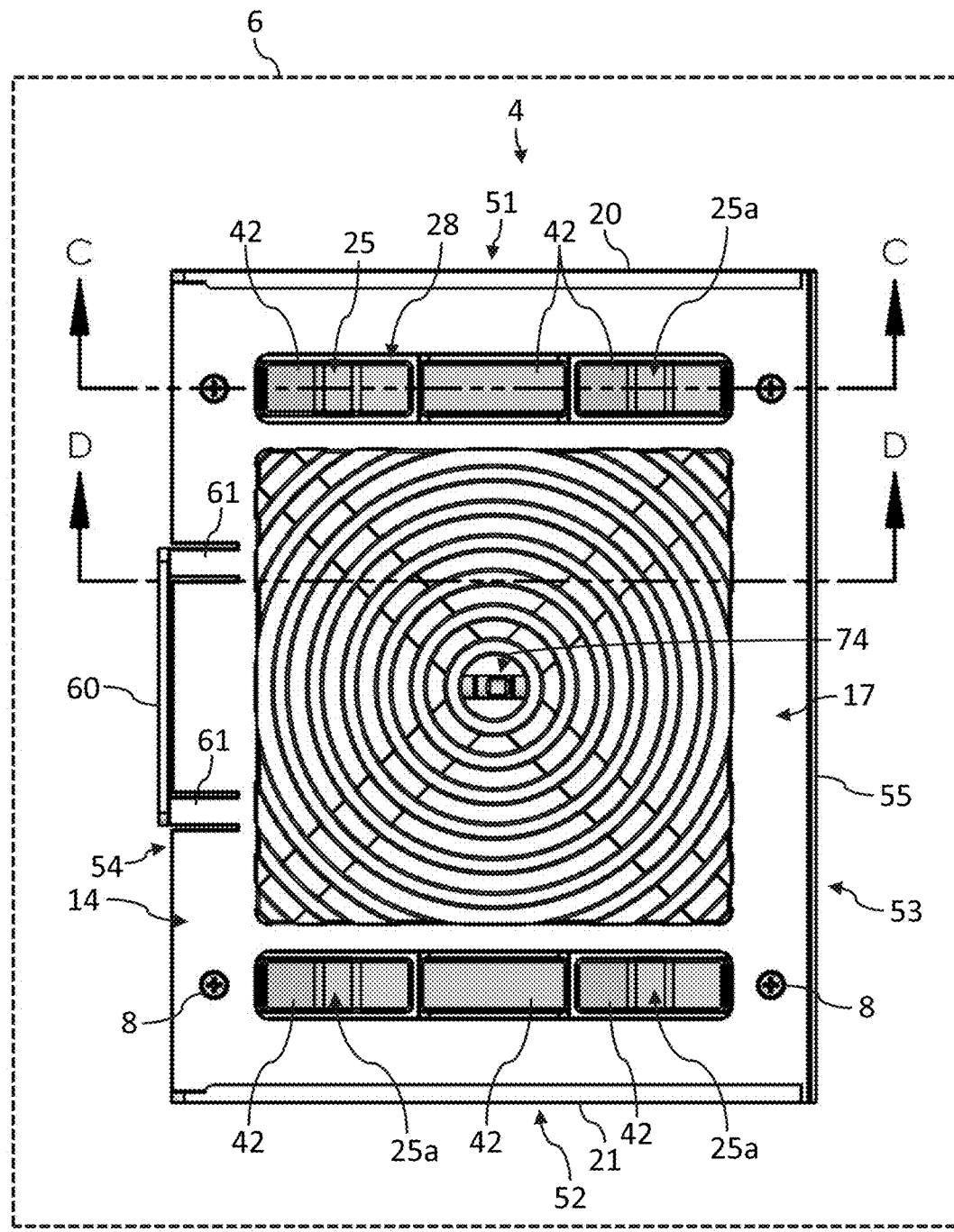
FIG. 6 illustrates a front view of the mounting system coupled to a wall, according to some embodiments.
Figure 7:
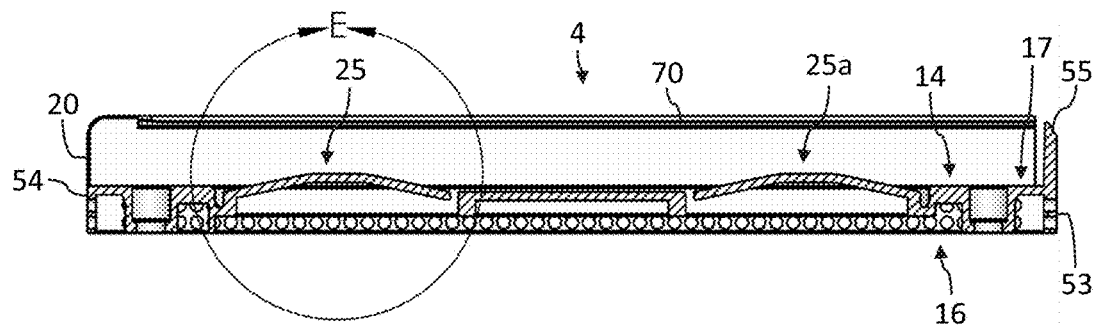
FIG. 7 illustrates a cross-sectional view taken along Line C-C in FIG. 6, according to some embodiments.
Figure 8:
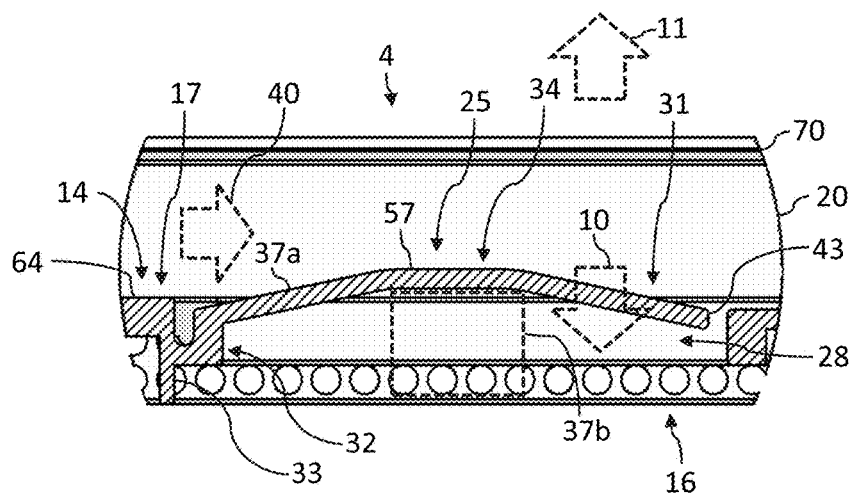
FIG. 8 illustrates a detailed view of the area indicated by Circle E in FIG. 7, according to some embodiments.

FIG. 6 illustrates a front view of the mounting system 4 coupled to a wall 6. The protrusions 25, 25a are each supported at one end to form cantilever beams. (A small portion of the wall 6 is shown in FIG. 6.) FIG. 7 illustrates a cross-sectional view taken along Line C-C in FIG. 6. FIG. 8 illustrates a detailed view of the area indicated by Circle E in FIG. 7.

Referring now primarily to FIGS. 6-8, the base 14 comprises a hole 28. The first protrusion 25 can be spring-loaded outward from the hole 28. The first protrusion 25 can be configured such that pressing the first protrusion 25 inward moves at least a second portion 31 of the first protrusion 25 inward through the hole 28 of the base 14. Moving at least a second portion 31 of the first protrusion 25 inward through the hole 28 can be accomplished by moving the first protrusion 25 part way through the hole 28 and does not necessarily mean moving an object all the way through the hole 28. The hole 28 can be a "through hole" or can be a hole with a closed bottom (such as a valley). In some embodiments, the hole 28 is much wider than it is deep. Thus, holes can be very shallow.

Embodiments can use any type of spring. For example, embodiments can use cantilever springs, coil springs, tension springs, extension springs, torsion springs, constant springs, variable springs, flat springs, machined springs, serpentine springs, helical springs, volute springs, hairsprings, balance springs, leaf springs, V-springs, Belleville springs, gas springs, mainsprings, negator springs, progressive rate coil springs, rubber bands, spring washers, torsion springs, and/or wave springs. Springs can be made from any suitable material including molded plastic, elastic materials, and/or spring steel.

For example, the first protrusion 25 can comprise a spring portion 37a configured to flex (e.g., to create a flex arm of a cantilever beam). Bending the spring 37a can cause portions 31 and 34 to move inward (as indicated by the arrow 10 in FIG. 8).

Embodiments can also include other types of springs (e.g., a coil spring 37b). The spring 37b can be located inward relative to the first protrusion 25 such that the first protrusion 25 has a neutral position (as illustrated in FIG. 8) located in an insertion path 40 of the electronic device 2. Moving the first protrusion 25 inward can compress the spring 37b such that the spring 37b resists inward movement of the first protrusion 25.

In several embodiments, the base 14 comprises a hole 28 configured to enable the first protrusion 25 to move inward through the hole 28 (e.g., as the first protrusion 25 is pressed inward in response to inserting the electronic device 2 into the mount). At least a first portion 32 of the first protrusion 25 can be anchored to a side 33 of the hole 28. As used herein, anchor means to hold in place. An anchor can be a rigid connection. In some embodiments, anchors are not rigid connections but instead are features that block unwanted movement. For example, an anchor can be an outer wall that prevents the first protrusion 25 from moving too far outward while still permitting the first protrusion 25 to move inward in response to inserting the electronic device 2.

In some embodiments, at least a portion of the first protrusion 25 is located between the first sidewall 20 and the second sidewall 21. A spring can couple the protrusion to the base 14 such that coupling the electronic device 2 to the base 14 (by placing the electronic device 2 at least partially between the first sidewall 20 and the second sidewall 21) presses the protrusion inward by overcoming a resistance force of the spring. The spring can be any type of spring including a cantilever spring and a coil spring.

In several embodiments, the first protrusion 25 comprises a cantilever beam having a first portion 32 anchored to the base 14 and a second portion 31 configured to bend inward (as indicated by arrow 10) in response to coupling the electronic device 2 to the base 14 by placing the electronic device 2 at least partially between the first sidewall 20 and the second sidewall 21.

In some embodiments, the first portion 32 is located farther inward than the second portion 34 such that (A) the first portion 32 is not configured to collide with the electronic device 2 as the electronic device 2 is coupled to the mounting system 4 and (B) the second portion 34 is configured to collide with the electronic device 2 as the electronic device 2 is coupled to the mounting system 4.

In some embodiments, the cantilever beam is curved such that the first portion 32 is located further inward than the second portion 34. The cantilever beam can comprise a first section and a second section. The first section can be oriented at a greater angle relative to the base 14 than the second section is oriented relative to the base 14. (The outer-facing wall 64 of the base 14 can define the orientation of the base 14.) The angle of the first section can facilitate a gradual transition as the electronic device 2 is inserted into the mount such that pressing the cantilever beam inward does not require a large electronic device 2 insertion force.

In several embodiments, the base 14 comprises a hole 28. The cantilever beam can be located at least partially inside the hole 28 such that the second portion 31, 34 of the cantilever beam is configured to bend inward at least partially through the hole 28 in response to coupling the electronic device 2 to the base 14.

In some embodiments, the first portion 32 is anchored to the base 14 inside the hole 28 of the base 14. The second portion 34 can be located outward relative to the hole 28 such that the second portion 34 is configured to collide with the electronic device 2 as the electronic device 2 is coupled to the mounting system 4.

Mounts can be machined and/or formed from a metal such as steel or aluminum. Mounts can also be made by molding plastic.

Mounting systems can be molded from acrylonitrile butadiene styrene ("ABS"). In some embodiments, surfaces of the mounting systems that may touch portions of the electronic device are overmolded with a softer material, which can be a thermoplastic elastomer ("TPE").

Referring now primarily to FIGS. 5 and 6, a rubber layer 42 can be coupled to an outward facing surface of the cantilever beam. The system can comprise the electronic device 2 coupled at least partially between the first sidewall 20 and the second sidewall 21 such that at least a portion of the rubber layer 42 is compressed between the electronic device 2 and the cantilever beam (as illustrated in FIG. 5).

The base 14 and sidewalls 20, 21 (and other parts of the mount 4) can be made from a first material. The first material can be molded plastic. The rubber layer 42 can be made from a second material that is softer than the first material.

Referring now primarily to FIGS. 1 and 8, the system 4 is configured to enable inserting the electronic device 2 into the system 4 in a first direction 40. The first protrusion 25 can comprise a cantilever beam 25 having an anchored end 32 and a distal end 43 configured to move relative to the anchored end 32. The cantilever beam 25 comprises an orientation defined from the anchored end to the distal end 43. The orientation can be within plus or minus 30 degrees of parallel to or perpendicular to the first direction 40. As used herein, distal end means situated away from the point of attachment.

In several embodiments, the base 14 can comprise a hole 28. The cantilever beam can be located at least partially in the hole 28. The cantilever beam can be curved outward. The cantilever beam can be configured to move at least partially inward through the hole 28 in response to coupling the electronic device 2 to the base 14.

Referring now primarily to FIGS. 1, 3, 6, 8, and 9, the base 14 comprises a first side 51 coupled to the first sidewall 20, a second side 52 located opposite the first side 51 and coupled to the second sidewall 21, a third side 53 having a third sidewall 55 oriented within plus or minus 20 degrees of perpendicular to the first sidewall 20 and the second sidewall 21, and a fourth side 54 located opposite the third side 53 and configured to enable inserting the electronic device 2 at least partially into the mounting system 4 between the first sidewall 20 and the second sidewall 21. The first protrusion 25 can have an outermost portion 57 (labeled in FIG. 8) located between the first sidewall 20 and the second sidewall 21. The outermost portion 57 can be coupled to the base 14 by a spring such that a neutral position of the outermost portion 57 is located in an insertion path 40 of the electronic device 2 such that inserting the electronic device 2 pushes the outermost portion 57 inward while the outermost portion 57 applies an outward force on the electronic device 2. The first sidewall 20 and the second sidewall 21 can be configured to resist the outward force of the first protrusion 25 (e.g., as explained in the context of FIG. 4).

Embodiments can comprise additional protrusions 25a, 25b, 25c that can include all of the features of first protrusions 25. In some embodiments, the protrusions 25, 25a, 25b, 25c are oriented in opposite directions and/or are space apart in a rectangle shape.

The outward force of the first protrusion 25 can help hold the electronic device 2 snugly inside the mount by effectively removing extra space inside the mount. While the extra space is necessary due to manufacturing tolerances (e.g., variation in mount dimensions and electronic device 2 dimensions), the extra space can cause the electronic device 2 to rattle inside the mount 4. Thus, removing the extra space increases the perceived quality of the mounting system 4.

FIG. 7 illustrates a first protrusion 25 that protrudes towards the third side 53. FIG. 7 also illustrates a second protrusion 25a that protrudes towards a fourth side 54.

In several embodiments, the first protrusion 25 protrudes towards the fourth side 54. In some embodiments, the first protrusion 25 protrudes away from the fourth side 54. As used herein, the first protrusion 25 can protrude toward the fourth side 54 without protruding directly towards the fourth side 54. As used herein, the first protrusion 25 can protrude away from the fourth side 54 without protruding directly away from the fourth side 54. "Toward" is used broadly to mean in the direction of an object and does not require pointing exactly at an object. For example, protruding towards a side can be accomplished by protruding in a direction that makes the distal end of the protrusion closer to the side.

Figure 9:
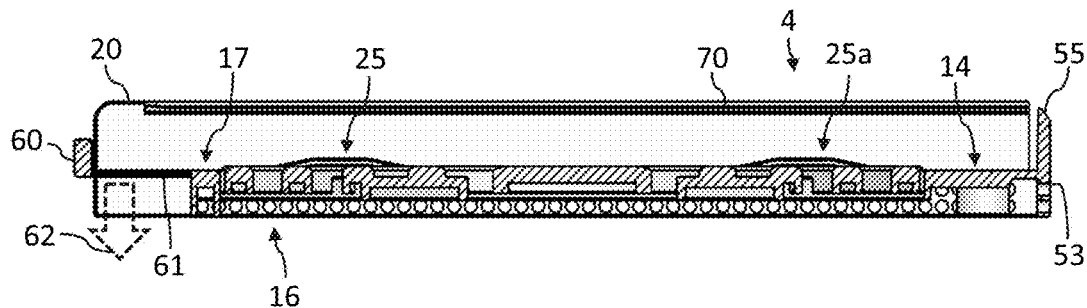
FIG. 9 illustrates a cross-sectional view taken along Line D-D in FIG. 6, according to some embodiments.
Figure 10:
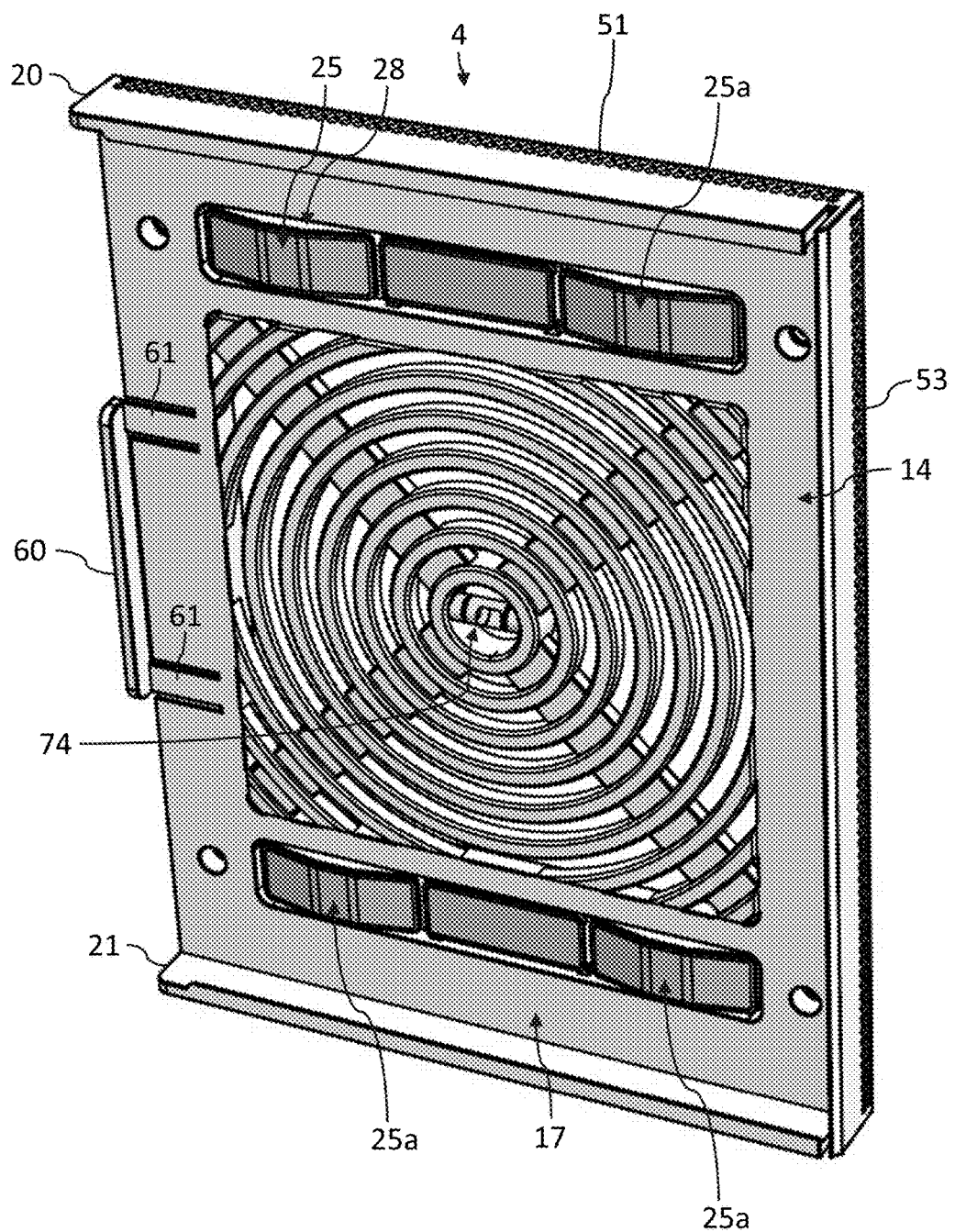
FIG. 10 illustrates a front perspective view of the mounting system illustrated in FIG. 6, according to some embodiments.
Figure 11:
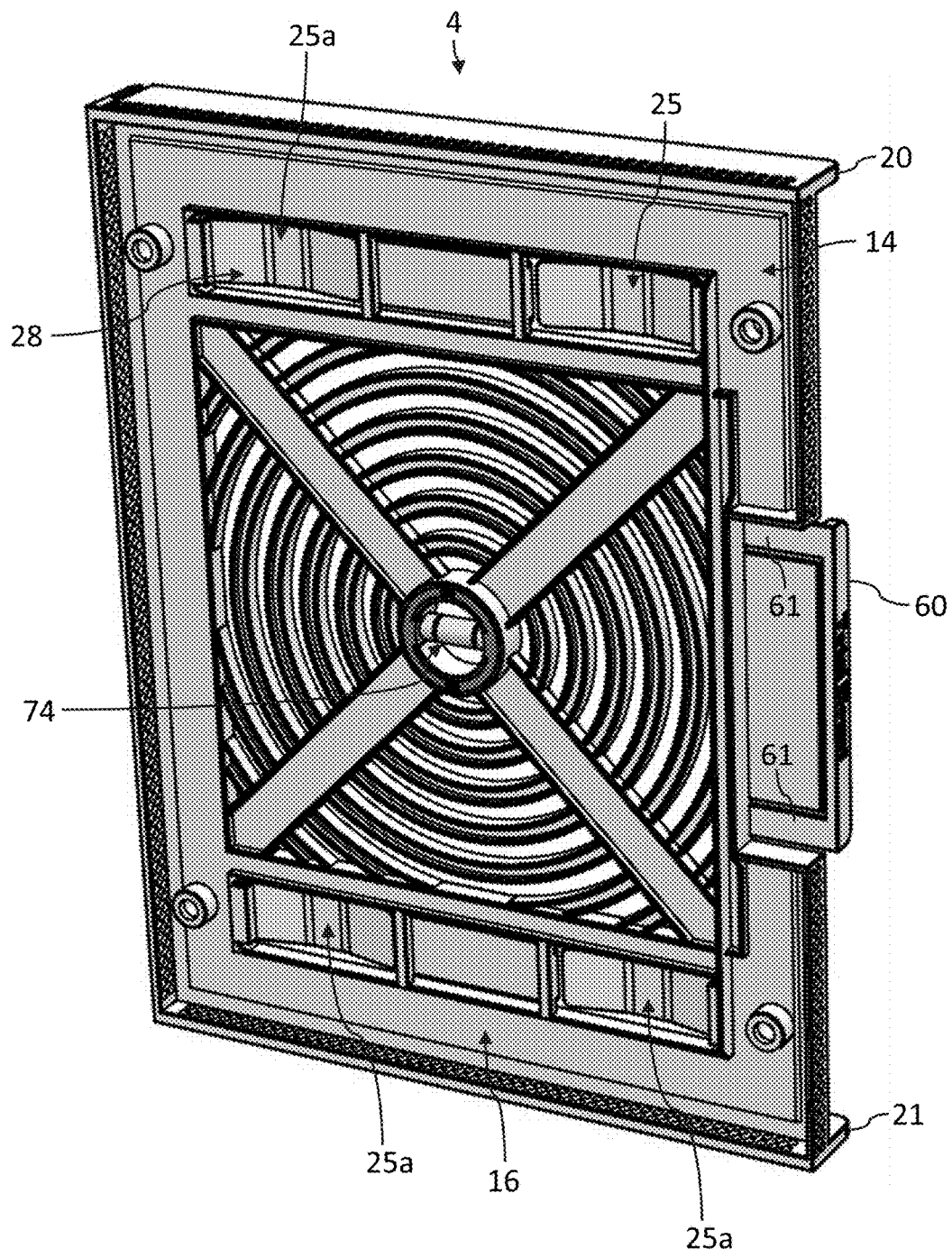
FIG. 11 illustrates a back perspective view of the mounting system illustrated in FIG. 6, according to some embodiments.
Figure 12:
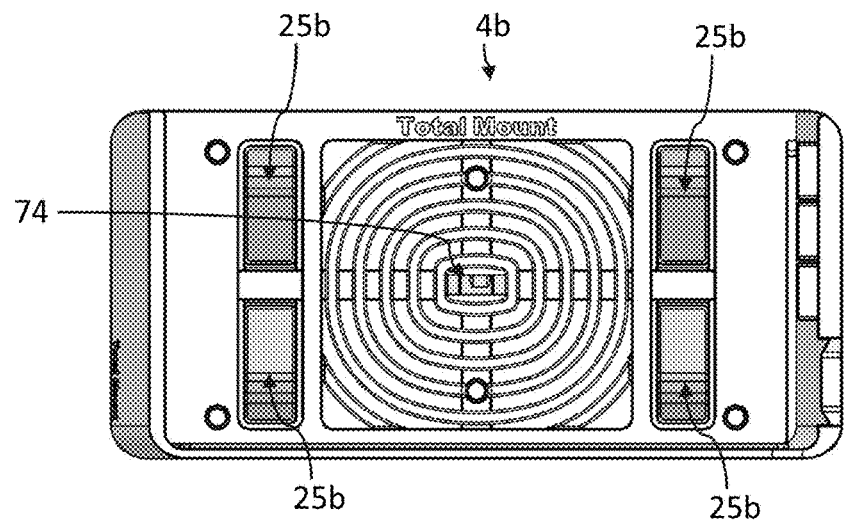
FIG. 12 illustrates a front view of a mounting system, according to some embodiments.
Figure 13:
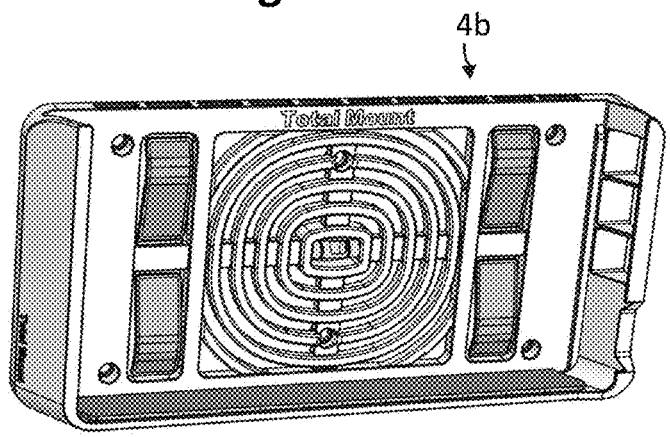
FIGS. 13 and 14 illustrate front perspective views of the mounting system illustrated in FIG. 12, according to some embodiments.
Figure 14:
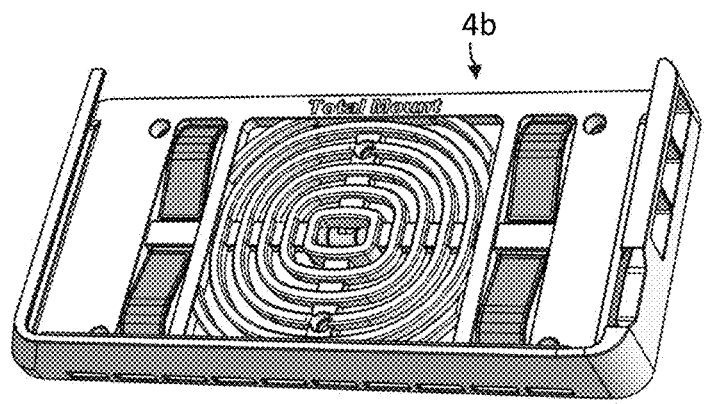
Figure 15:
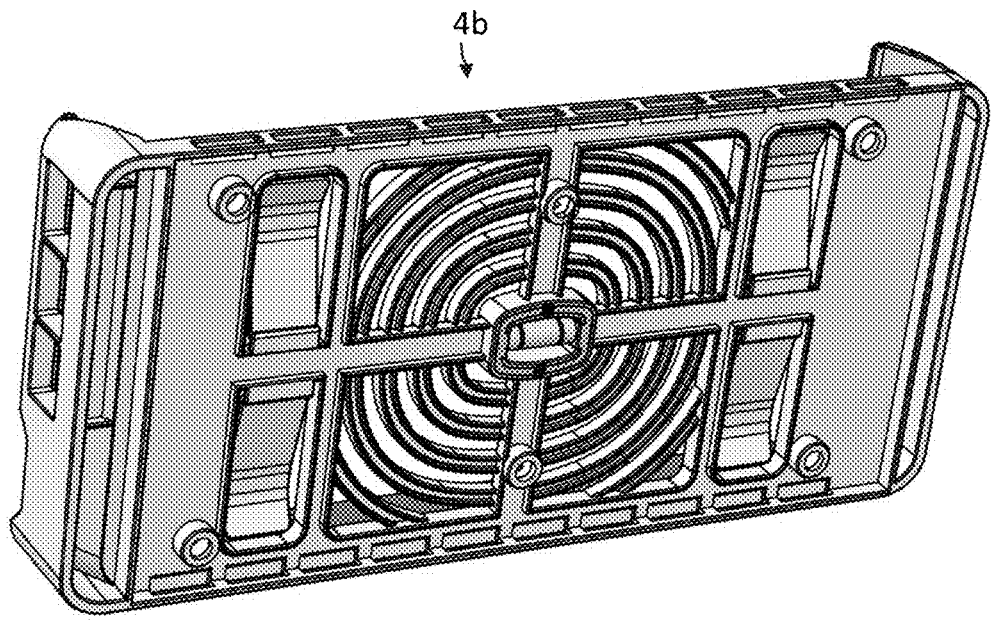
FIGS. 15 and 16 illustrate back perspective views of the mounting system illustrated in FIG. 12, according to some embodiments.
Figure 16:
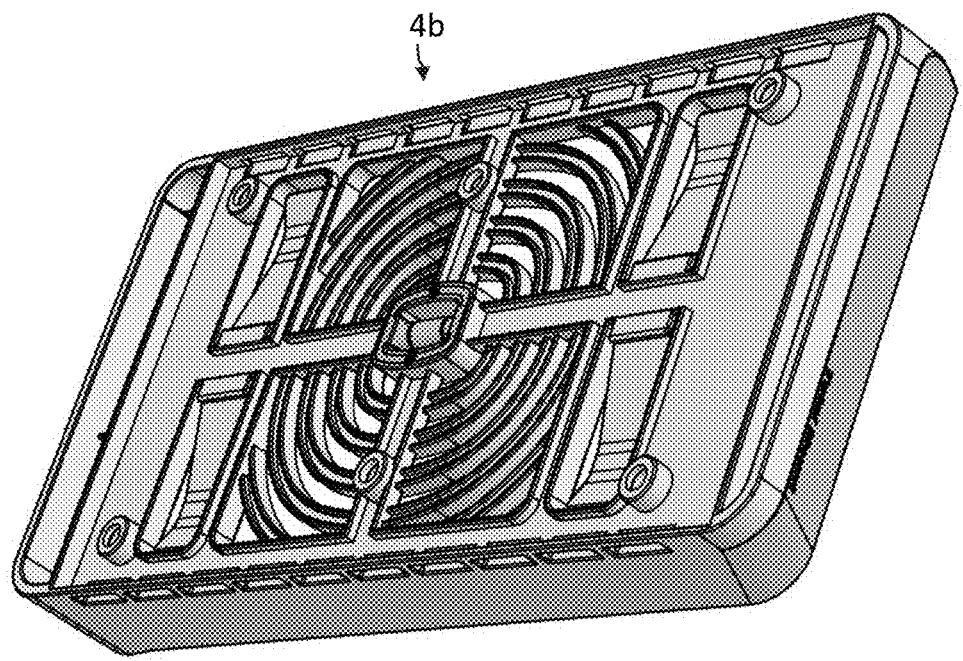
Figure 17:
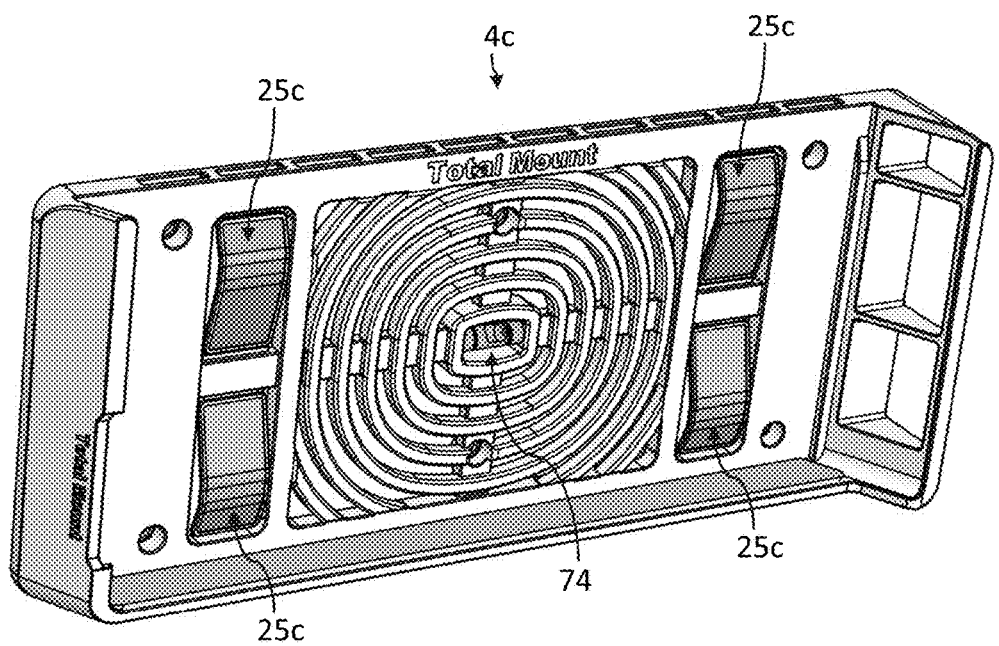
FIG. 17 illustrates a front, top, and side perspective view of a mounting system, according to some embodiments.
Figure 18:
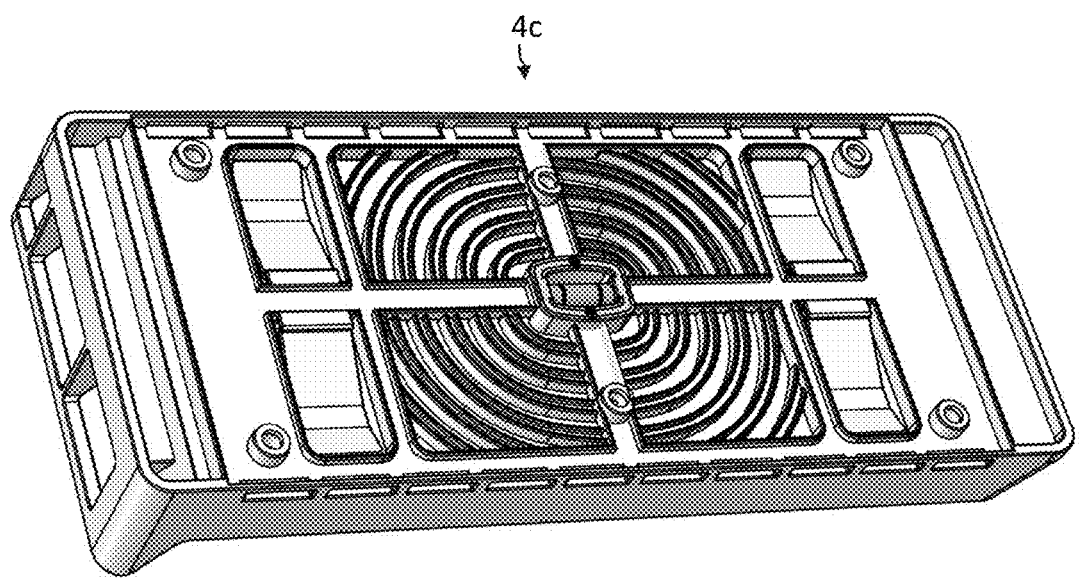
FIG. 18 illustrates a back, bottom, and side perspective view of the mounting system illustrated in FIG. 17, according to some embodiments.
Figure 19:
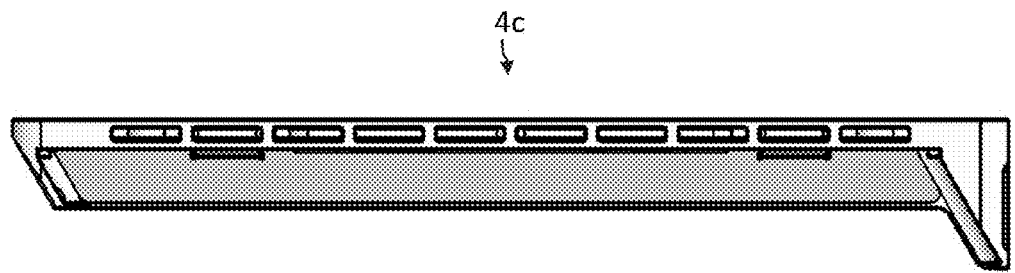
FIG. 19 illustrates a top view of the mounting system illustrated in FIG. 17, according to some embodiments.
Figure 20:
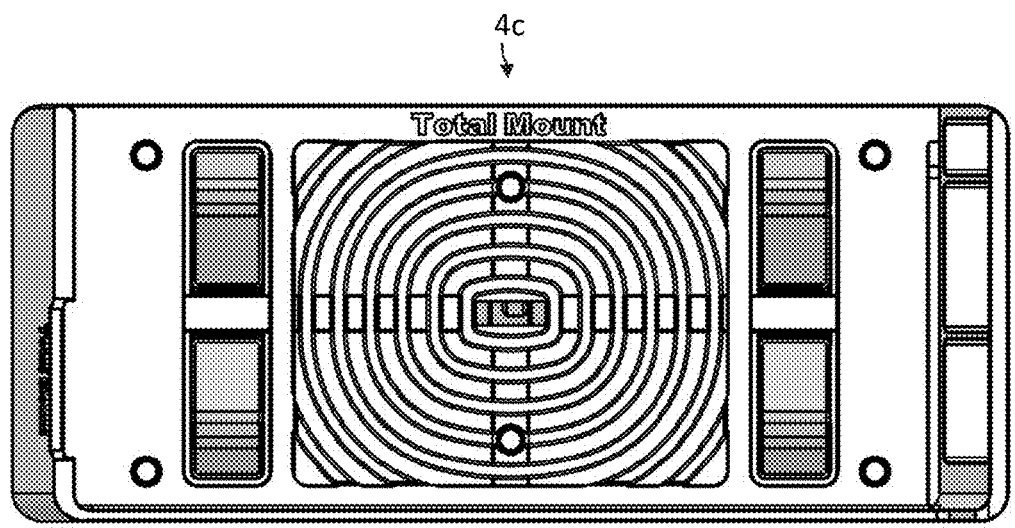
FIG. 20 illustrates a front view of the mounting system illustrated in FIG. 17, according to some embodiments.
Figure 21:
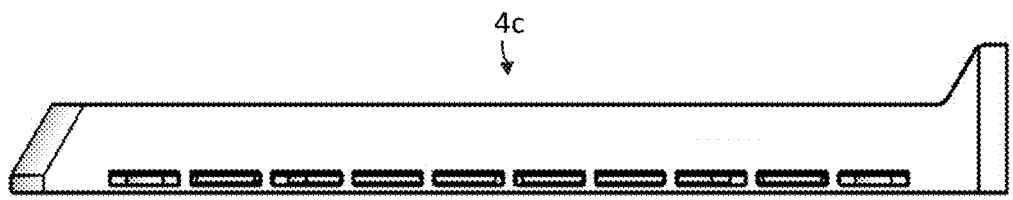
FIG. 21 illustrates a bottom view of the mounting system illustrated in FIG. 17, according to some embodiments.
Figure 22:
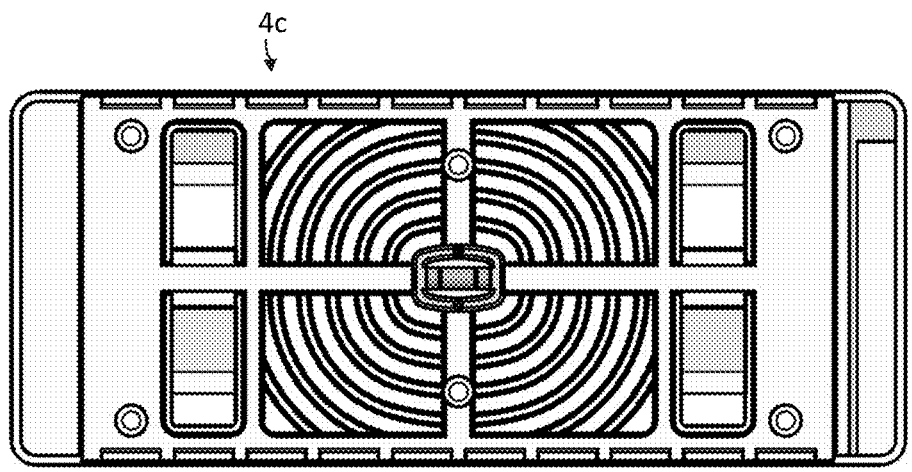
FIG. 22 illustrates a back view of the mounting system illustrated in FIG. 17, according to some embodiments.
Figure 23:
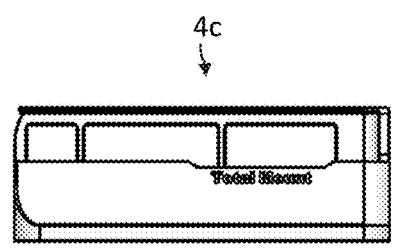
FIG. 23 illustrates a first side view of the mounting system illustrated in FIG. 17, according to some embodiments.
Figure 24:
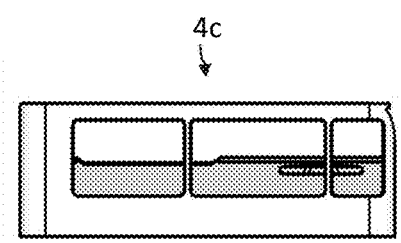
FIG. 24 illustrates a second side view of the mounting system illustrated in FIG. 17, according to some embodiments.

FIG. 9 illustrates a cross-sectional view taken along Line D-D in FIG. 6. The mounting system 4 can comprise a fourth sidewall 60 located opposite the third sidewall 55 and coupled to the base 14 by a flex arm 61 configured to bend to enable the fourth sidewall 60 to move inward out of the insertion path 40 of the electronic device 2. The arrow 62 illustrated in FIG. 9 indicates the fourth sidewall 60 moving inward due to bending of the flex arm 61. The fourth sidewall 60 can be much smaller than other sidewalls. The fourth sidewall 60 can help secure the electronic device 2 inside the mount 4 until the user pushes the fourth sidewall 60 inward to remove the electronic device 2 from the mount 4.

Referring now primarily to FIGS. 2-5 and 8, an electronic device 2 can be located at least partially between the first sidewall 20 and the second sidewall 21. As illustrated in FIG. 5, the first protrusion 25 (see FIG. 8) can be spring-loaded outward towards a first inward-facing wall 65 of the electronic device 2 such that the first inward-facing wall 65 of the electronic device 2 presses the first protrusion 25 inward.

In several embodiments, the electronic device 2 is located at least partially between an outward-facing wall 64 (see FIG. 5) of the base 14 and a second inward-facing wall 67 (see FIG. 4) coupled to the base 14 by the first sidewall 20. As illustrated in FIG. 8, the first protrusion 25 can be coupled to the base 14 by a second protrusion 32 located farther inward than the outward-facing wall 64 of the base 14. The first protrusion 25 can be located farther outward than the outward-facing wall 64 of the base 14.

The second inward-facing wall 67 can be part of a retaining lip 70 (e.g., a protrusion oriented within plus or minus 20 degrees of perpendicular to the sidewall 20). The sidewall 20 can couple the retaining lip 70 to the base 14. The retaining lip 70 can be located at least partially inside a groove 71 of the electronic device 2 such that the retaining lip 70 prevents the electronic device 2 from falling out of the mounting system 4 (as illustrated in FIG. 4). Inserting the electronic device 2 into the mounting system 4 (as indicated by the arrow 5 in FIG. 1) can cause the retaining lip 70 to slide into the groove 71. The electronic device 2 comprises an inward portion 2a.

In other embodiments, the retaining lip 70 is located outward relative to an outermost surface 77 of the electronic device 2 such that the retaining lip 70 engages the outermost surface 77 to prevent the electronic device 2 from falling out of the mounting system 4. (The outermost surface 77 of the electronic device 2 is labeled in FIG. 3.)

As shown in FIG. 6, the mounting system 4 can comprise a bubble level 74 configured to indicate whether the mounting system 4 is coupled to a wall 6 in a level manner. The bubble level 74 can comprise a hollow tube partially filled with a liquid such that the extra space inside the sealed tube comprises an air bubble. The position of the air bubble can indicate whether the mounting system 4 is level.

FIGS. 12-16 illustrate another mounting system 4b that can use any of the elements described in the context of the mounting system 4 shown in FIGS. 1-11. FIGS. 17-24 illustrate another mounting system 4c that can use any of the elements described in the context of the mounting system 4 shown in FIGS. 1-11. Additional mounting systems are illustrated in U.S. patent application Ser. Nos. 29/581,848;

29/581,849; 29/582,715; 15/131,337 and 29/540,690, the entire contents of which are incorporated by reference herein.

Any of the systems described herein can be used with any of the methods described herein. Any of the methods described herein can be used with any of the systems described herein. Each of the system embodiments can be used as method embodiments.

In some embodiments, methods comprise coupling an electronic device 2 to a wall 6 (e.g., a wall of a building, a wall of a television). Embodiments can comprise obtaining a mounting system 4 comprising a base 14 having a backside 16 facing inward towards the wall 6 and a frontside 17 facing outward away from the wall 6; a first sidewall 20 and a second sidewall 21 that are coupled to the base 14, protrude away from the wall 6, and secure the electronic device 2 to the base 14; and a first protrusion 25 coupled to the base 14 and configured to push the electronic device 2 outward away from the wall 6.

Methods can comprise coupling the mounting system 4 to the wall 6. Methods can comprise overcoming a spring force of the first protrusion 25 to move the first protrusion 25 inward towards the wall 6 by inserting at least a portion of the electronic device 2 between the first sidewall 20 and the second sidewall 21 such that the first protrusion 25 presses the electronic device 2 outward while the first sidewall 20 and the second sidewall 21 block the electronic device 2 from moving outward.

In several embodiments, the first protrusion 25 comprises a cantilever beam having a first portion 32 anchored to the base 14 and a second portion 31, 34 coupled to the first portion 32. Embodiments can comprise bending the second portion 31, 34 inward in response to coupling the electronic device 2 to the base 14.

In some embodiments, the first protrusion 25 is spring-loaded outward from a hole 28. Embodiments can comprise pressing the first protrusion 25 inward (such that the first protrusion 25 moves at least a second portion 31, 34 of the first protrusion 25 inward through the hole 28) by inserting the electronic device 2 into the mount such that at least a portion of the electronic device 2 is located between the first sidewall 20 and the second sidewall 21. A spring can be located between the first protrusion 25 and an inward side of the base 14 such that the spring is configured to press the first protrusion 25 outward into the insertion path 40 of the electronic device 2.

INTERPRETATION

"Electronic device" can comprise any electronic device, such as a streaming media player, a gaming console, a cable box (for providing digital cable television content from a cable provider to a television), and any other electronic device.

The term "wall" is used broadly. Wall can comprise any surface located along a television, such as a backside surface of a television. Wall can also comprise any wall associated with a building (e.g., a home, an office building, a school, etc.), such as an interior wall and/or an exterior wall.

None of the steps described herein is essential or indispensable. Any of the steps can be adjusted or modified. Other or additional steps can be used. Any portion of any of the steps, processes, structures, and/or devices disclosed or illustrated in one embodiment, flowchart, or example in this specification can be combined or used with or instead of any other portion of any of the steps, processes, structures, and/or devices disclosed or illustrated in a different embodiment, flowchart, or example. The embodiments and examples provided herein are not intended to be discrete and separate from each other.

The section headings and subheadings provided herein are nonlimiting. The section headings and subheadings do not represent or limit the full scope of the embodiments described in the sections to which the headings and subheadings pertain. For example, a section titled "Topic 1" may include embodiments that do not pertain to Topic 1 and embodiments described in other sections may apply to and be combined with embodiments described within the "Topic 1" section.

Some of the devices, systems, embodiments, and processes use computers. Each of the routines, processes, methods, and algorithms described in the preceding sections may be embodied in, and fully or partially automated by, code modules executed by one or more computers, computer processors, or machines configured to execute computer instructions. The code modules may be stored on any type of non-transitory computer-readable storage medium or tangible computer storage device, such as hard drives, solid state memory, flash memory, optical disc, and/or the like. The processes and algorithms may be implemented partially or wholly in application-specific circuitry. The results of the disclosed processes and process steps may be stored, persistently or otherwise, in any type of non-transitory computer storage such as, e.g., volatile or non-volatile storage.

The various features and processes described above may be used independently of one another, or may be combined in various ways. All possible combinations and subcombinations are intended to fall within the scope of this disclosure. In addition, certain method, event, state, or process blocks may be omitted in some implementations. The methods, steps, and processes described herein are also not limited to any particular sequence, and the blocks, steps, or states relating thereto can be performed in other sequences that are appropriate. For example, described tasks or events may be performed in an order other than the order specifically disclosed. Multiple steps may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require at least one of X, at least one of Y, and at least one of Z to each be present.

The term "and/or" means that "and" applies to some embodiments and "or" applies to some embodiments. Thus, A, B, and/or C can be replaced with A, B, and C written in one sentence and A, B, or C written in another sentence. A, B, and/or C means that some embodiments can include A and B, some embodiments can include A and C, some embodiments can include B and C, some embodiments can only include A, some embodiments can include only B, some embodiments can include only C, and some embodiments can include A, B, and C. The term "and/or" is used to avoid unnecessary redundancy.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions, and changes in the form of the methods and systems described herein may be made without departing from the spirit of the inventions disclosed herein.

The following is claimed:

1. A mounting system configured to couple an electronic device to a wall, the mounting system comprising:
    a base having a backside configured to face inward towards the wall and a frontside configured to face outward away from the wall;
    a first sidewall and a second sidewall that are coupled to the base, are configured to protrude away from the wall, and are configured to secure the electronic device to the base; and
    a first protrusion,
    wherein the base comprises a first side coupled to the first sidewall, a second side located opposite the first side and coupled to the second sidewall, a third side having a third sidewall oriented within plus or minus 20 degrees of perpendicular to the first and second sidewalls, and a fourth side located opposite the third side and configured to enable inserting the electronic device at least partially into the mounting system between the first and second sidewalls,
    wherein the first protrusion has an outermost portion located between the first and second sidewalls, the outermost portion is coupled to the base by a spring such that a neutral position of the outermost portion is located in an insertion path of the electronic device such that inserting the electronic device pushes the outermost portion inward while the outermost portion applies an outward force on the electronic device, and the first and second sidewalls are configured to resist the outward force of the first protrusion,
    the mounting system further comprising a fourth sidewall located opposite the third sidewall and coupled to the base by a flex arm configured to bend to enable the fourth sidewall to move inward out of the insertion path of the electronic device.

2. The mounting system of claim 1, wherein the mounting system comprises a hole, the first protrusion is spring-loaded from the hole, and the first protrusion is configured such that pressing the first protrusion moves at least a second portion of the first protrusion at least partially through the hole of the base.

3. The mounting system of claim 2, wherein at least a first portion of the first protrusion is anchored to a side of the hole.

4. The mounting system of claim 1, wherein at least a portion of the first protrusion is located between the first and second sidewalls, and the spring couples the protrusion to the base such that coupling the electronic device to the base by placing the electronic device at least partially between the first and second sidewalls presses the protrusion inward by overcoming a resistance force of the spring.

5. The mounting system of claim 1, wherein the first protrusion comprises a cantilever beam having a first portion coupled to the base and a second portion configured to bend in response to coupling the electronic device to the base by placing the electronic device at least partially between the first and second sidewalls.

6. The mounting system of claim 5, wherein the first portion is configured to not collide with the electronic device as the electronic device is coupled to the mounting system and the second portion is configured to collide with the electronic device as the electronic device is coupled to the mounting system.

7. The mounting system of claim 5, wherein the cantilever beam is curved such that the first portion is configured to not collide with the electronic device as the electronic device is coupled to the mounting system and the second portion is configured to collide with the electronic device as the electronic device is coupled to the mounting system.

8. The mounting system of claim 5, wherein the mounting system comprises a hole, and the cantilever beam is located at least partially inside the hole such that the second portion of the cantilever beam is configured to bend at least partially through the hole in response to coupling the electronic device to the base.

9. The mounting system of claim 5, wherein the mounting system comprises a hole, and the first portion is anchored to the hole, and the second portion is located at least partially outside the hole such that the second portion is configured to collide with the electronic device as the electronic device is coupled to the mounting system.

10. The mounting system of claim 5, further comprising a rubber layer coupled to a surface of the cantilever beam, and further comprising the electronic device coupled at least partially between the first and second sidewalls such that at least a portion of the rubber layer is compressed between the electronic device and the cantilever beam.

11. The mounting system of claim 1, wherein the system is configured to enable inserting the electronic device into the system in a first direction, the first protrusion comprises a cantilever beam having an anchored end and a distal end configured to move relative to the anchored end, wherein the cantilever beam comprises an orientation defined from the anchored end to the distal end, and the orientation is within plus or minus 30 degrees of parallel to or perpendicular to the first direction.

12. The mounting system of claim 11, wherein the mounting system comprises a hole, the cantilever beam is located at least partially in the hole, and the cantilever beam is configured to move at least partially through the hole in response to coupling the electronic device to the base.

13. The mounting system of claim 1, wherein the first protrusion protrudes towards the fourth side.

14. The mounting system of claim 1, wherein the first protrusion protrudes away from the fourth side.

15. The mounting system of claim 1, further comprising the electronic device located at least partially between the first and second sidewalls, wherein the first protrusion is spring-loaded towards a first wall of the electronic device such that the first wall of the electronic device presses the first protrusion.

16. The mounting system of claim 15, wherein the first protrusion comprises a cantilever beam having an anchored end and a distal end configured to move relative to the anchored end, the mounting system comprises a hole, and the cantilever beam is located at least partially in the hole.

\* \* \* \* \*